(12) United States Patent
Kuruba Buchannagari et al.

(10) Patent No.: US 10,396,741 B2
(45) Date of Patent: Aug. 27, 2019

(54) HEADSET WITH PROGRAMMABLE MICROPHONE MODES

(71) Applicant: Voyetra Turtle Beach, Inc., Valhalla, NY (US)

(72) Inventors: Shobha Devi Kuruba Buchannagari, Fremont, CA (US); Richard Kulavik, San Jose, CA (US)

(73) Assignee: Voyetra Turtle Beach, Inc., Valhalla, NY (US)

( * ) Notice: Subject to any disclaimer, the term of this patent is extended or adjusted under 35 U.S.C. 154(b) by 10 days.

(21) Appl. No.: 14/712,488

(22) Filed: May 14, 2015

(65) Prior Publication Data
US 2016/0336913 A1 Nov. 17, 2016

(51) Int. Cl.
H03G 3/20 (2006.01)
H03G 3/32 (2006.01)
H04R 1/10 (2006.01)

(52) U.S. Cl.
CPC ............. H03G 3/32 (2013.01); H04R 1/1041 (2013.01); H04R 1/1083 (2013.01); H04R 2410/05 (2013.01)

(58) Field of Classification Search
CPC ... H03G 3/32; H03G 3/34; H03G 3/341; H03G 3/342; H03G 3/344; H03G 3/345; H03G 3/347; H03G 3/348; H04R 1/20; H04R 1/22; H04R 1/222; H04R 1/225; H04R 1/227; H04R 1/24; H04R 1/245; H04R 1/26; H04R 1/265; H04R 1/1083; H04R 1/1041; H04R 1/1091; H04R 2410/01; H04R 2410/03; H04R 2410/05; H04R 2430/20; H04R 2430/21; H04R 2430/23; H04R 2430/25; H04R 2460/00; H04R 2460/01; H04R 2460/07; H04R 2499/11; H04R 2201/109; H04R 2201/107; H04R 2420/07; H04R 2400/01; G10K 11/175; G10K 11/178; G10K 11/1782; (Continued)

(56) References Cited

U.S. PATENT DOCUMENTS

2009/0252355 A1* 10/2009 Mao ................. H04R 1/1083
 381/309
2011/0103626 A1* 5/2011 Bisgaard .............. H04R 3/005
 381/313

(Continued)

Primary Examiner — Leshui Zhang
(74) Attorney, Agent, or Firm — McAndrews, Held & Malloy

(57) ABSTRACT

A method and system for a headset with programmable modes, where the headset comprises a speaker and a beamforming microphone: sensing an ambient sound level near the headset, and configuring the headset in one of a plurality of modes by configuring a beam pattern of the beamforming microphone based on at least the sensed ambient noise level. A user of the headset may configure the headset in the one of the plurality of modes or it may be automatically configured. The beamforming microphone may comprise an array of sound sensing elements. The headset may be configured in a quiet mode when the sensed ambient sound level is below that of a desired sound source and may be configured with a wide beam pattern. The headset may be configured in a loud mode when the sensed ambient sound level is above that of a desired sound source.

20 Claims, 9 Drawing Sheets

(58) Field of Classification Search
CPC ........... G10K 11/1784; G10K 11/1786; G10K 11/1788; G10K 11/18; A61F 11/06
USPC ... 381/74, 72, 73.1, 92, 26, 91, 122, 56, 57, 381/61, 77, 94.1–94.9, 107, 79, 86, 93, 381/312–322, 70, 71.1–71.12, 123; 700/94; 455/570, 575.2, 114.2; 379/406.01–406.16
See application file for complete search history.

(56) References Cited

U.S. PATENT DOCUMENTS

| | | | |
|---|---|---|---|
| 2012/0020485 A1* | 1/2012 | Visser | H04R 3/005 |
| | | | 381/57 |
| 2012/0224709 A1* | 9/2012 | Keddem | H04B 1/46 |
| | | | 381/74 |
| 2015/0003652 A1* | 1/2015 | Bisgaard | H04R 25/50 |
| | | | 381/314 |
| 2015/0043741 A1* | 2/2015 | Shin | H04R 5/033 |
| | | | 381/66 |

* cited by examiner

HEADSET WITH PROGRAMMABLE MICROPHONE MODES

CLAIM OF PRIORITY

N/A

INCORPORATION BY REFERENCE

N/A

TECHNICAL FIELD

Aspects of the present application relate to audio headsets, and more specifically, to methods and systems for a headset with programmable microphone modes.

BACKGROUND

Limitations and disadvantages of conventional approaches to audio processing for headsets will become apparent to one of skill in the art, through comparison of such approaches with some aspects of the present method and system set forth in the remainder of this disclosure with reference to the drawings.

BRIEF SUMMARY

Methods and systems are provided for a headset with programmable microphone modes, substantially as illustrated by and/or described in connection with at least one of the figures, as set forth more completely in the claims.

DETAILED DESCRIPTION

Certain aspects of the disclosure may be found in a headset with programmable microphone modes. Example aspects of the disclosure may comprise, in a headset that comprises a speaker and a beamforming microphone, sensing an ambient sound level near the headset and configuring the headset in one of a plurality of modes by configuring a beam pattern of the beamforming microphone based on at least the sensed ambient noise level. A user of the headset may configure the headset in the one of the plurality of modes, or the headset may be automatically configured in the one of the plurality of modes. The beamforming microphone may comprise an array of sound sensing elements. The headset may be configured in a quiet mode when the sensed ambient sound level is below that of a desired sound source. The beamforming microphone may be configured with a wide beam pattern when the headset is in the quiet mode. The headset may be configured in a loud mode when the sensed ambient sound level is above that of a desired sound source. The beamforming microphone may be configured with a narrow beam pattern directed at the desired sound source when the headset is in the loud mode. The headset may be configured in the one of the plurality of modes utilizing a gaming console.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry or a device is "operable" to perform a function whenever the circuitry or device comprises the necessary hardware and code (if any is necessary) to perform the function, regardless of whether performance of the function is disabled or not enabled (e.g., by a user-configurable setting, factory trim, etc.).

Figure 1A:
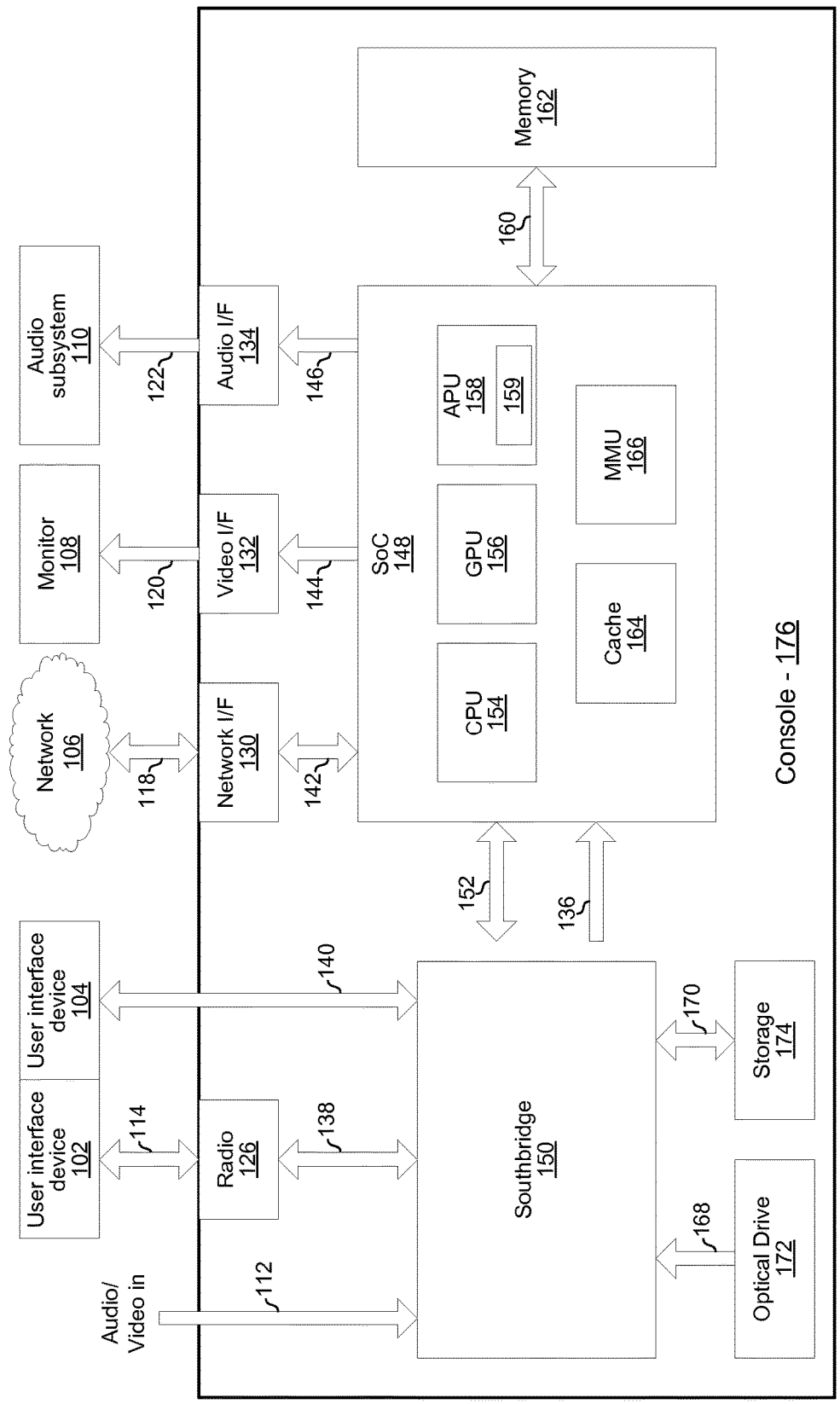
FIG. 1A depicts an example gaming console.

Referring to FIG. 1A, there is shown game console 176 which may be, for example, a Windows computing device, a Unix computing device, a Linux computing device, an Apple OSX computing device, an Apple iOS computing device, an Android computing device, a Microsoft Xbox, a Sony Playstation, a Nintendo Wii, or the like. The example game console 176 comprises a video interface 124, radio 126, data interface 128, network interface 130, video interface 132, audio interface 134, southbridge 150, main system on chip (SoC) 148, memory 162, optical drive 172, and storage device 174. The SoC 148 comprises central processing unit (CPU) 154, graphics processing unit (GPU) 156, audio processing unit (APU) 158, cache memory 164, and memory management unit (MMU) 166. The various components of the game console 176 are communicatively coupled through various busses/links 136, 128, 142, 144, 146, 152, 160, 169, and 170.

The southbridge 150 comprises circuitry that supports one or more data bus protocols such as High-Definition Multimedia Interface (HDMI), Universal Serial Bus (USB), Serial Advanced Technology Attachment 2 (SATA 2), embedded multimedia card interface (e.MMC), Peripheral Component Interconnect Express (PCIe), or the like. The southbridge 150 may receive audio and/or video from an external source via link 112 (e.g., HDMI), from the optical drive (e.g., Blu-Ray) 172 via link 168 (e.g., SATA 2), and/or from storage 174 (e.g., hard drive, FLASH memory, or the like) via link 170 (e.g., SATA 2 and/or e.MMC). Digital audio and/or video is output to the SoC 148 via link 136 (e.g., CEA-861-E compliant video and IEC 61937 compliant audio). The southbridge 150 exchanges data with radio 126 via link 138 (e.g., USB), with external devices via link 140

(e.g., USB), with the storage 174 via the link 170, and with the SoC 148 via the link 152 (e.g., PCIe).

The radio 126 comprises circuitry operable to communicate in accordance with one or more wireless standards such as the IEEE 802.11 family of standards, the Bluetooth family of standards, and/or the like.

The network interface 130 may comprise circuitry operable to communicate in accordance with one or more wired standards and to convert between wired standards. For example, the network interface 130 may communicate with the SoC 148 via link 142 using a first standard (e.g., PCIe) and may communicate with the network 106 using a second standard (e.g., gigabit Ethernet).

The video interface 132 may comprise circuitry operable to communicate video in accordance with one or more wired or wireless video transmission standards. For example, the video interface 132 may receive CEA-861-E compliant video data via link 144 and encapsulate/format/etc., the video data in accordance with an HDMI standard for output to the monitor 108 via an HDMI link 120.

The audio interface 134 may comprise circuitry operable to communicate audio in accordance with one or more wired or wireless audio transmission standards. For example, the audio interface 134 may receive CEA-861-E compliant video data via link 144 and encapsulate/format/etc. The video data in accordance with an HDMI standard for output to the monitor 108 via an HDMI link 120.

The central processing unit (CPU) 154 may comprise circuitry operable to execute instructions for controlling/coordinating the overall operation of the game console 176. Such instructions may be part of an operating system of the console and/or part of one or more software applications running on the console.

The graphics processing unit (GPU) 156 may comprise circuitry operable to perform graphics processing functions such as compression, decompression, encoding, decoding, 3D rendering, and/or the like.

The audio processing unit (APU) 158 may comprise circuitry operable to perform audio processing functions such as volume/gain control, compression, decompression, encoding, decoding, surround-sound processing, and/or the like to output single channel or multi-channel (e.g., 2 channels for stereo or 5, 7, or more channels for surround sound) audio signals. The APU 158 comprises memory (e.g., volatile and/or nonvolatile memory) 159 which stores parameter settings that affect processing of audio by the APU 158. For example, the parameter settings may include a first audio gain/volume setting that determines, at least in part, a volume of game audio output by the console 176 and a second audio gain/volume setting that determines, at least in part, a volume of chat audio output by the console 176. The parameter settings may also comprise settings for various modes for a headset coupled to the console. The parameter settings may be modified via a graphical user interface (GUI) of the console and/or via an application programming interface (API) provided by the console 176.

In another example scenario, the APU 158 may be operable to control modes of one or more microphones in a headset in communication with the game console 176. In an example scenario, the audio subsystem 110 may comprise a headset that may communicate with the APU 158 via the audio I/F 134. Furthermore, the one or more microphones in the headset may comprise beamforming microphones, such that the sensitivity pattern, or beam pattern, for the microphones may be configured depending on the ambient noise levels of the environment, for example. In instances when the game console 176 and an associated headset are in a quiet environment, the APU 158 may configure the microphone(s) to have a broad or omnidirectional beam pattern, and when the game console 176 is in a noisy environment, the microphones may be configured with a narrow beam pattern to maximize reception of the desired source while minimizing reception of noise sources. One such example would be when the game console 176 is in a gaming competition and it would be advantageous to filter out the other players' voice commands utilizing a beamforming microphone.

Figure 2A:
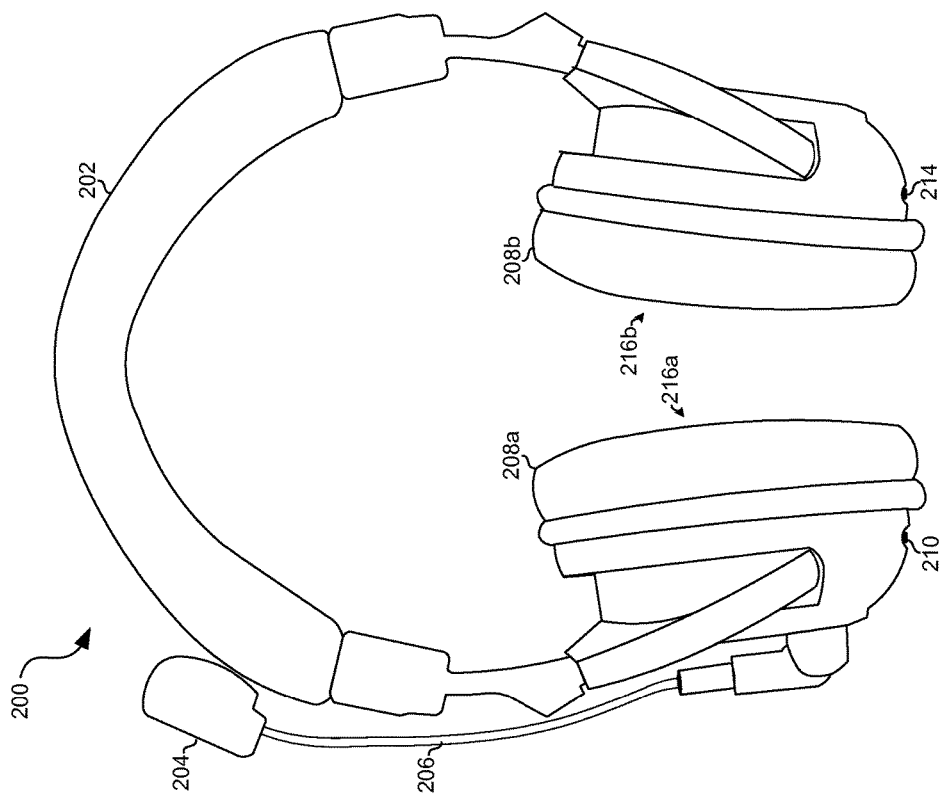
FIGS. 2A and 2B depict two views of an example embodiment of a gaming headset.
Figure 2B:
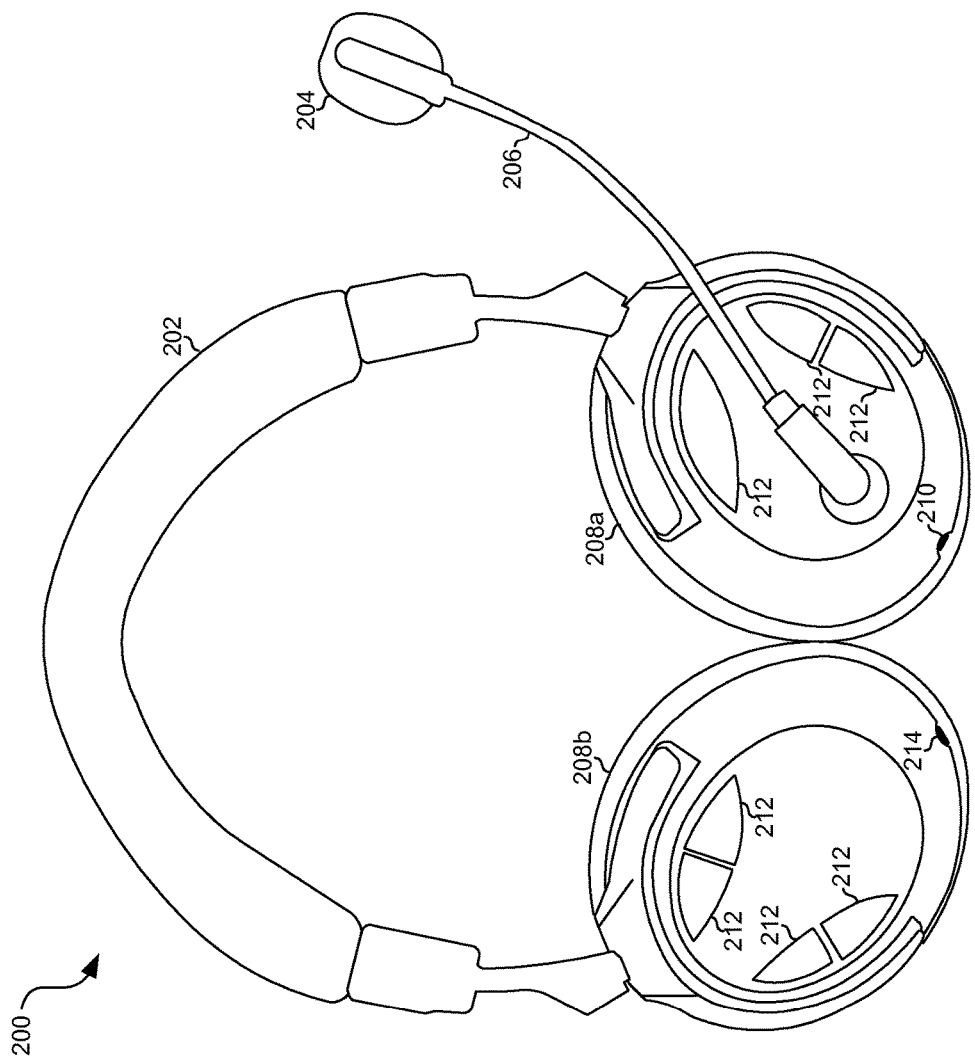
Figure 2C:
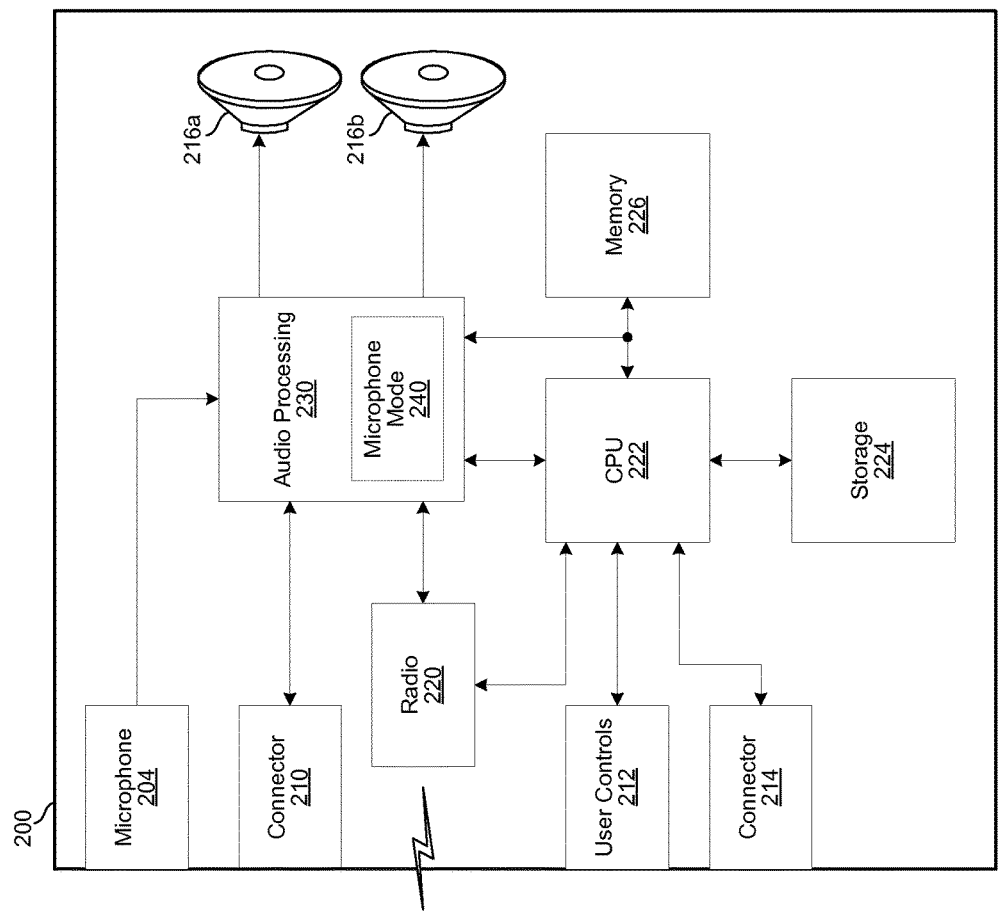
FIG. 2C depicts a block diagram of the example headset of FIGS. 2A and 2B.

In another example scenario, the microphone modes may be configured by circuitry in the headset as opposed to the game console 176, as shown further with respect to FIG. 2C. Furthermore, a plurality of modes may be configured in addition to "quiet," "normal," and "noisy" modes.

The cache memory 164 comprises high-speed memory (typically DRAM) for use by the CPU 154, GPU 156, and/or APU 158. The memory 162 may comprise additional memory for use by the CPU 154, GPU 156, and/or APU 158. The memory 162, typically DRAM, may operate at a slower speed than the cache memory 164 but may also be less expensive than cache memory as well as operate at a higher-speed than the memory of the storage device 174. The MMU 166 controls accesses by the CPU 154, GPU 156, and/or APU 158 to the memory 162, the cache 164, and/or the storage device 174.

In FIG. 1A, the example game console 176 is communicatively coupled to a user interface device 102, a user interface device 104, a network 106, a monitor 108, and audio subsystem 110.

Each of the user interface devices 102 and 104 may comprise, for example, a game controller, a keyboard, a motion sensor/position tracker, or the like. The user interface device 102 communicates with the game console 176 wirelessly via link 114 (e.g., Wi-Fi Direct, Bluetooth, and/or the like). The user interface device 102 communicates with the game console 176 via the wired link 140 (e.g., USB or the like).

The network 160 comprises a local area network and/or a wide area network. The game console 176 communicates with the network 106 via wired link 118 (e.g., Gigabit Ethernet).

The monitor 108 may be, for example, a LCD, OLED, or PLASMA screen. The game console 176 sends video to the monitor 108 via link 120 (e.g., HDMI).

The audio subsystem 110 may be, for example, a headset, a combination of headset and audio basestation, or a set of speakers and accompanying audio processing circuitry. The game console 176 sends audio to the subsystem 110 via link(s) 122 (e.g., S/PDIF for digital audio or "line out" for analog audio). Additional details of an example audio subsystem 110 are described below.

Figure 1B:
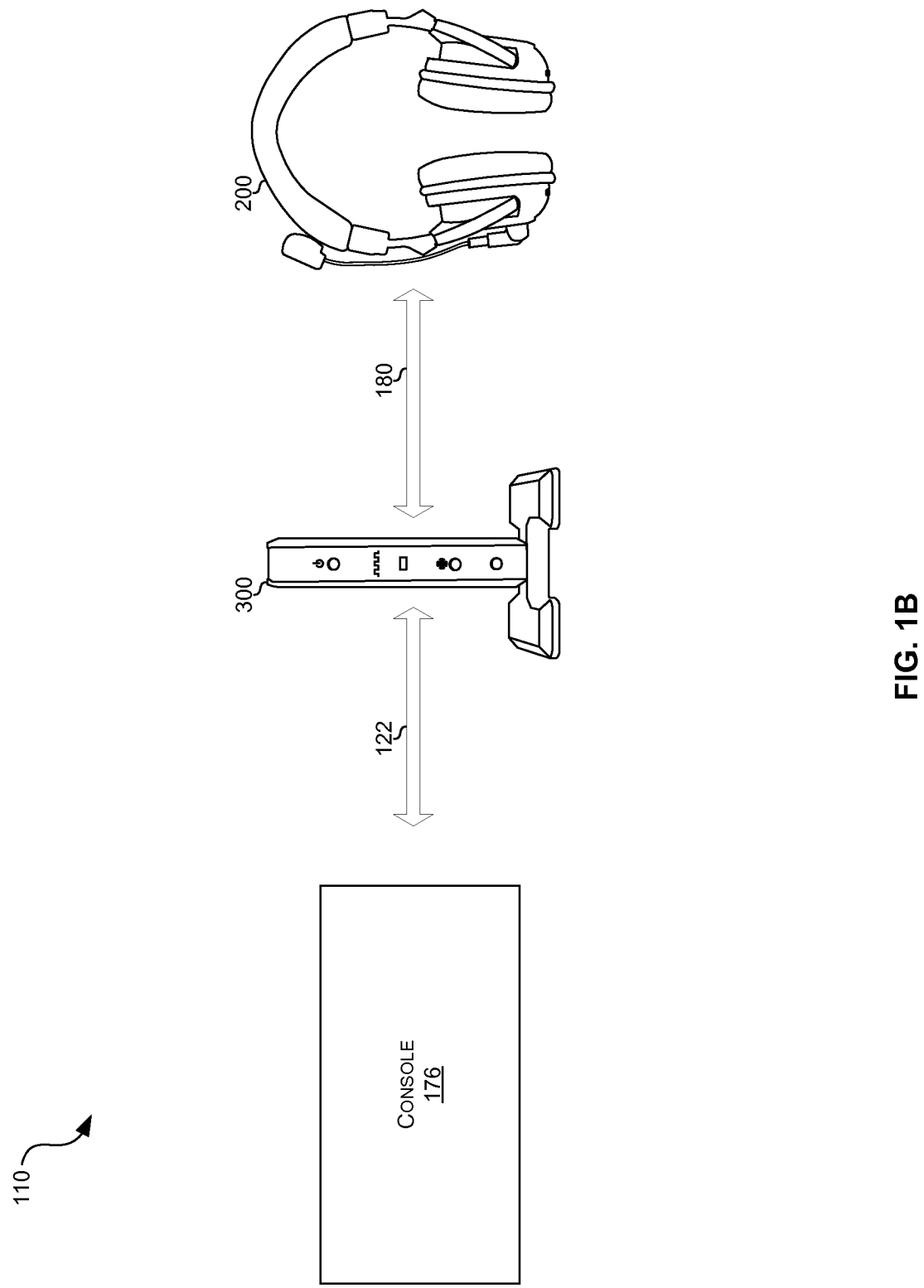
FIG. 1B depicts an example gaming audio subsystem comprising a headset and an audio basestation.

FIG. 1B depicts an example gaming audio subsystem comprising a headset and an audio basestation. Shown in a headset 200 and an audio basestation 300. The headset 200 communicates with the basestation 300 via a link 180 and the basestation 300 communicates with the console 176 via a link 122. The link 122 may be as described above. In an example implementation, the link 180 may be a proprietary wireless link operating in an unlicensed frequency band. The headset 200 may be as described below with reference to FIGS. 2A-2C.

Referring to FIG. 1C, again shown is the console 176 connected to a plurality of peripheral devices and a network 106. The example peripheral devices shown include a monitor 108, a user interface device 102, a headset 200, an audio basestation 300, and a multi-purpose device 192.

The monitor 108 and user interface device 102 are as described above. An example implementation of the headset 200 is described below with reference to FIGS. 2A-2C. In an example scenario, the headset 200 may comprise directional microphones that may be configured based on the audio environment around the headset 200.

The multi-purpose device 192 may be, for example, a tablet computer, a smartphone, a laptop computer, or the like that runs an operating system such as Android, Linux, Windows, iOS, OSX, or the like. Hardware (e.g., a network adaptor) and software (i.e., the operating system and one or more applications loaded onto the device 192) may configure the device 192 for operating as part of the GPN 190. For example, an application running on the device 192 may cause display of a graphical user interface via which a user can access gaming-related data, commands, functions, parameter settings, etc. and via which the user can interact with the console 176 and the other devices of the GPN 190 to enhance his/her gaming experience.

The peripheral devices 102, 108, 192, 200, 300 are in communication with one another via a plurality of wired and/or wireless links (represented visually by the placement of the devices in the cloud of GPN 190). Each of the peripheral devices in the gaming peripheral network (GPN) 190 may communicate with one or more others of the peripheral devices in the GPN 190 in a single-hop or multi-hop fashion. For example, the headset 200 may communicate with the basestation 300 in a single hop (e.g., over a proprietary RF link) and with the device 192 in a single hop (e.g., over a Bluetooth or Wi-Fi direct link), while the tablet may communicate with the basestation 300 in two hops via the headset 200. As another example, the user interface device 102 may communicate with the headset 200 in a single hop (e.g., over a Bluetooth or Wi-Fi direct link) and with the device 192 in a single hop (e.g., over a Bluetooth or Wi-Fi direct link), while the device 192 may communicate with the headset 200 in two hops via the user interface device 102. These example interconnections among the peripheral devices of the GPN 190 are merely examples, any number and/or types of links among the devices of the GPN 190 is possible.

The GPN 190 may communicate with the console 176 via any one or more of the connections 114, 140, 122, and 120 described above. The GPN 190 may communicate with a network 106 via one or more links 194 each of which may be, for example, Wi-Fi, wired Ethernet, and/or the like.

A database 182 which stores gaming audio data is accessible via the network 106. The gaming audio data may comprise, for example, signatures of particular audio clips (e.g., individual sounds or collections or sequences of sounds) that are part of the game audio of particular games, of particular levels/scenarios of particular games, particular characters of particular games, etc. In an example implementation, the database 182 may comprise a plurality of records 183, where each record 183 comprises an audio clip (or signature of the clip) 184, a description of the clip 184 (e.g., the game it is from, when it occurs in the game, etc.), one or more gaming commands 186 associated with the clip, one or more parameter settings 187 associated with the clip, and/or other data associated with the audio clip. Records 183 of the database 182 may be downloadable to, or accessed in real-time by, one or more devices of the GPN 190.

In an example scenario, the headset 200 may be configured in one of a plurality of modes depending on the ambient noise. For example, if the headset 200 is in a gaming tournament environment where the ambient noise level from multiple gamers is above that of the desired sound source, the voice of the headset user, the gaming console 176 and/or the headset itself may configure the headset 200 in a "noisy" mode where the beamforming capabilities of the one or more microphones may be utilized to sense audio signals from the user of the headset 200 while attenuating signals from other sources. In addition, the user may set the headset mode manually through a switch, button, or graphical user interface.

Alternatively, when the headset is in a low ambient noise environment, where the ambient noise is below that of a desired sound source, the headset 200 may be configured in a "quiet" mode where the beamforming capabilities of the one or more microphones may be utilized to sense audio signals with full sensitivity in all directions, since there are no significant noise sources present, thereby increasing the sound quality.

Figure 1C:
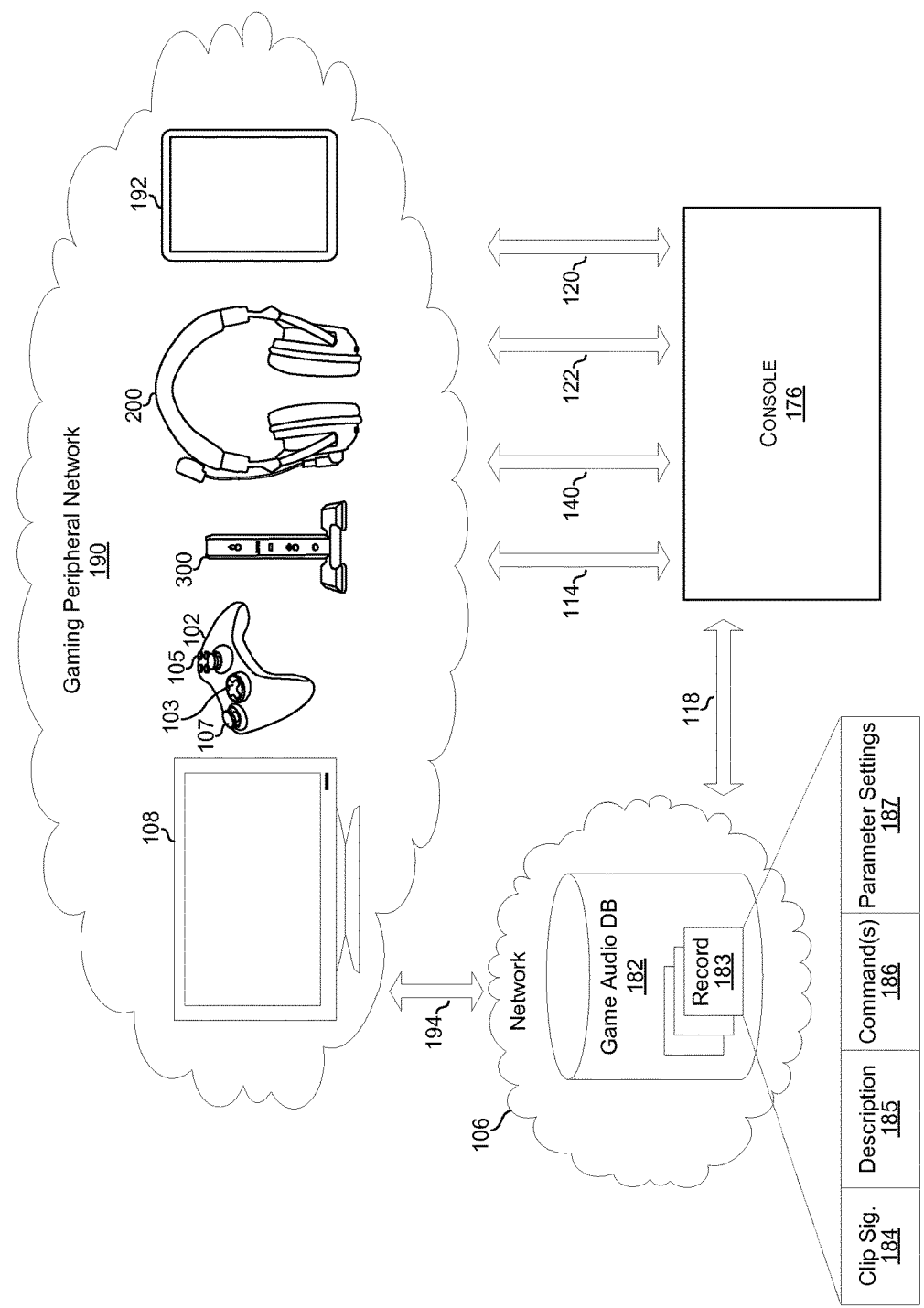
FIG. 1C depicts the example gaming console and an associated network of peripheral devices.

While the headset 200 in FIGS. 1A-1C is shown communicating with a gaming console 176, the disclosure is not so limited, as this is merely an example use for the headset 200. Accordingly, the headset 200 may be utilized in other applications, such as a cellular phone headset, or as a headset in any other communications protocol.

Referring to FIGS. 2A and 2B, there is shown two views of an example headset 200 that may present audio output by a gaming console such as the console 176. The headset 200 comprises a headband 202, a microphone boom 206 with microphone 204, ear cups 208a and 208b which surround speakers 216a and 216b, connector 210, connector 214, and user controls 212.

The connector 210 may be, for example, a 3.5 mm headphone socket for receiving analog audio signals (e.g., receiving chat audio via an Xbox "talkback" cable).

The microphone 204 converts acoustic waves (e.g., the voice of the person wearing the headset) to electric signals for processing by circuitry of the headset and/or for output to a device (e.g., console 176, basestation 300, a smartphone, and/or the like) that is in communication with the headset. In an example scenario, the microphone comprises a beamforming microphone, where an array of sound sensing elements are arranged with a known spacing and the resulting signals from the sensing elements may be utilized to determine the direction from which is sound is received.

The speakers 216a and 216b convert electrical signals to soundwaves.

The user controls 212 may comprise dedicated and/or programmable buttons, switches, sliders, wheels, etc., for performing various functions. Example functions which the controls 212 may be configured to perform include: power the headset 200 on/off, mute/unmute the microphone 204, control gain/volume of, and/or effects applied to, chat audio by the audio processing circuitry of the headset 200, control gain/volume of, and/or effects applied to, game audio by the audio processing circuitry of the headset 200, enable/disable/initiate pairing (e.g., via Bluetooth, Wi-Fi direct, or the like) with another computing device, and/or the like.

In an example scenario, the microphone 204 may comprise a directional microphone such that the sensitivity pattern may be configured depending on the acoustic environment. Accordingly, the user controls 212 may then also include settings for configuring the headset 200 and microphone 204 in different modes, such as "quiet," "normal," or "loud." In an alternative scenario, the mode of the microphone 204 may be configured automatically by controller circuitry in the headset 200 or the console 176, for example.

The connector 214 may be, for example, a USB port. The connector 214 may be used for downloading data to the headset 200 from another computing device and/or uploading data from the headset 200 to another computing device. Such data may include, for example, parameter settings (described below). Additionally, or alternatively, the connector 214 may be used for communicating with another computing device such as a smartphone, tablet compute, laptop computer, or the like.

FIG. 2C depicts a block diagram of the example headset 200. In addition to the connector 210, user controls 212, connector 214, microphone 204, and speakers 216a and 216b already discussed, shown are a radio 220, a CPU 222, a storage device 224, a memory 226, and an audio processing circuit 230.

The radio 220 may comprise circuitry operable to communicate in accordance with one or more standardized (such as, for example, the IEEE 802.11 family of standards, the Bluetooth family of standards, and/or the like) and/or proprietary wireless protocol(s) (e.g., a proprietary protocol for receiving audio from an audio basestation such as the basestation 300).

The CPU 222 may comprise circuitry operable to execute instructions for controlling/coordinating the overall operation of the headset 200. Such instructions may be part of an operating system or state machine of the headset 200 and/or part of one or more software applications running on the headset 200. In some implementations, the CPU 222 may be, for example, a programmable interrupt controller, a state machine, or the like.

The storage device 224 may comprise, for example, FLASH or other nonvolatile memory for storing data which may be used by the CPU 222 and/or the audio processing circuitry 230. Such data may include, for example, parameter settings that affect processing of audio signals in the headset 200 and parameter settings that affect functions performed by the user controls 212. For example, one or more parameter settings may determine, at least in part, a gain of one or more gain elements of the audio processing circuitry 230. As another example, one or more parameter settings may determine, at least in part, a frequency response of one or more filters that operate on audio signals in the audio processing circuitry 230. As yet another example scenario, the parameter settings may comprise settings for beamforming modes of the microphone 204, including mode settings for various ambient conditions near the headset 200.

Example parameter settings which affect audio processing are described in the co-pending U.S. patent application Ser. No. 13/040,144 titled "Gaming Headset with Programmable Audio" and published as US2012/0014553, the entirety of which is hereby incorporated herein by reference. Particular parameter settings may be selected autonomously by the headset 200 in accordance with one or more algorithms, based on user input (e.g., via controls 212), and/or based on input received via one or more of the connectors 210 and 214.

The memory 226 may comprise volatile memory used by the CPU 230 and/or audio processing circuit 230 as program memory, for storing runtime data, etc.

The audio processing circuit 230 may comprise circuitry operable to perform audio processing functions such as volume/gain control, compression, decompression, encoding, decoding, introduction of audio effects (e.g., echo, phasing, virtual surround effect, etc.), and/or the like. As described above, the processing performed by the audio processing circuit 230 may be determined, at least in part, by which parameter settings have been selected. The processing may be performed on game, chat, and/or microphone audio that is subsequently output to speaker 216a and 216b. Additionally, or alternatively, the processing may be performed on chat audio that is subsequently output to the connector 210 and/or radio 220.

In an example implementation, the audio processing circuit 230 may incorporate a microphone mode controller 240, which may configure the mode of the microphone 204. In an example scenario, the microphone 204 may operate in at least three modes, based on the ambient noise in the environment, "quiet," "normal," and "noisy." In "quiet" mode, the microphone mode controller 240 may configure the microphone 204 in a wide mode where the beamforming capability of the microphone may be set to receive at full sensitivity from all directions, while in "noisy" mode, the microphone mode controller 240 may configure the microphone 204 in a narrow mode where the beamforming capability may be set to receive mostly from a desired direction. The desired direction may be from the user's mouth, for example, while signals received from other directions are minimized in the beamforming. In addition, noise cancellation may be enabled when in "noisy" or "normal" mode, where some reduction of voice audio quality may be sacrificed for blocking out more noise. The mode may be selected by the user or may be selected automatically based on, for example, characteristics of the user's voice (e.g., they are whispering) and/or characteristics of the ambient noise.

In another example implementation, the mode of the headset 200, and thus the microphone 204, may be configured automatically based on location. If the headset 200 is located at a home location, coupled to a home gaming console, for example, the headset 200 may default to a "quiet" mode, assuming no ambient noise occurs that overcomes the level of the desired source.

Figure 3:
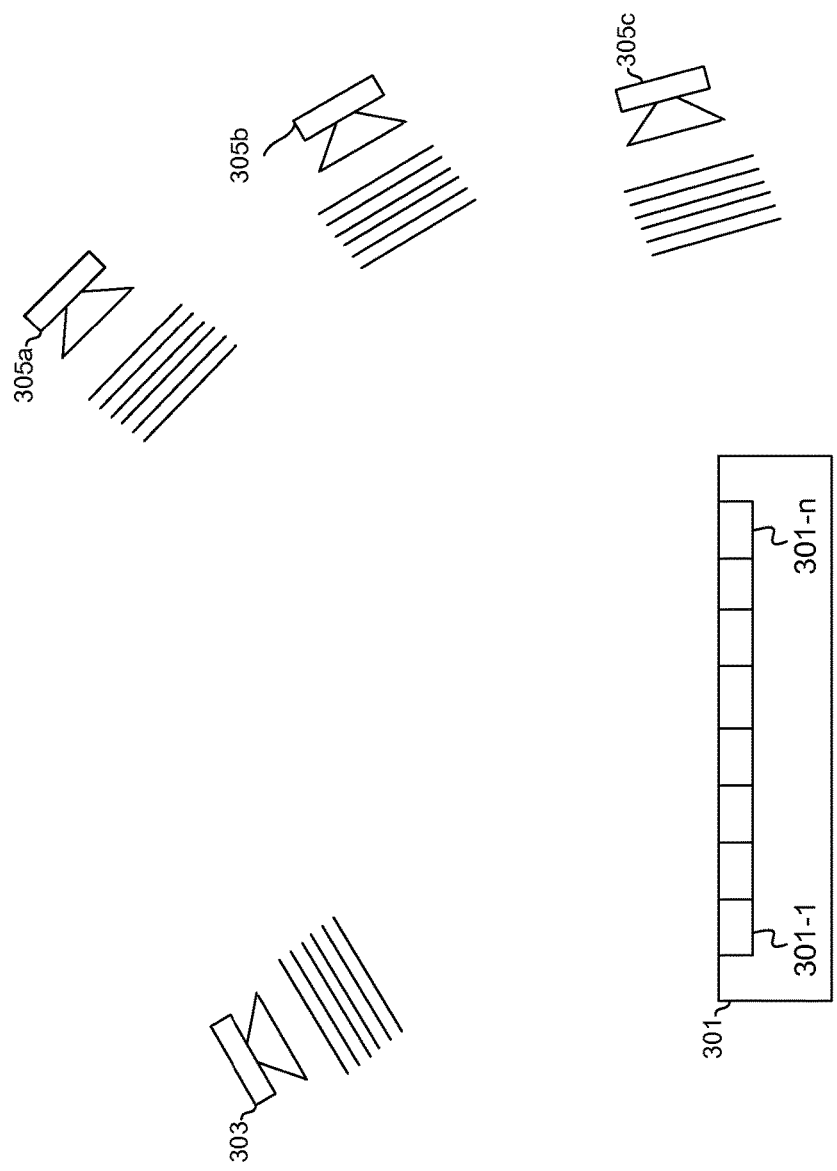
FIG. 3 depicts a beamforming microphone with a plurality of sound sources.

FIG. 3 depicts a beamforming microphone with a plurality of sound sources. Referring to FIG. 3, there is shown a beamforming microphone 301 comprising a plurality of microphone elements 301-1 to 301-n, which may comprise a linear or 2-D array of elements. There is also shown a desired sound source 303 and ambient noise sources 305a-305c.

The microphone elements 301-1 to 301-n may comprise Micro-Electrical Mechanical Systems (MEMS) structures, for example, for sensing sound waves, although the disclosure is not limited to MEMS devices and may comprise any sound conversion element. Since the direction from which a sound wave is received impacts the timing of the resulting signal at each element, the microphone elements 301-1 to 301-n may be utilized to detect sound from particular directions. If a sound source is directly perpendicular to the surface of the beamforming microphone 301, then the signals from each of the elements are correlated in time and reinforce one another. Therefore, by sensing signals at each element at a particular time, a configurable beam pattern results. The beam pattern of a beamforming microphone may also be configured by the number of elements and the spacing between them.

In operation, the beamforming microphone 301 may be configured in various modes depending on the ambient noise. For example, in a quiet room, the beamforming microphone 301 may be configured in a wide mode, detecting sound from all directions, while in a noisy environment, the beamforming microphone 301 may be configured in a narrow beam directed at a desired source 303, such as a user's mouth, for example, thereby reducing the communication of signals from the unwanted ambient noise sources 305a-305c. The ambient noise and microphone mode configuration may be performed continuously or periodically, or may be changed when coupled to different devices or moved to different locations, for example. In another example scenario, the microphone mode may be configured upon power up and remain in that mode if no not significant changes in measured sound intensity are detected.

Figure 4:
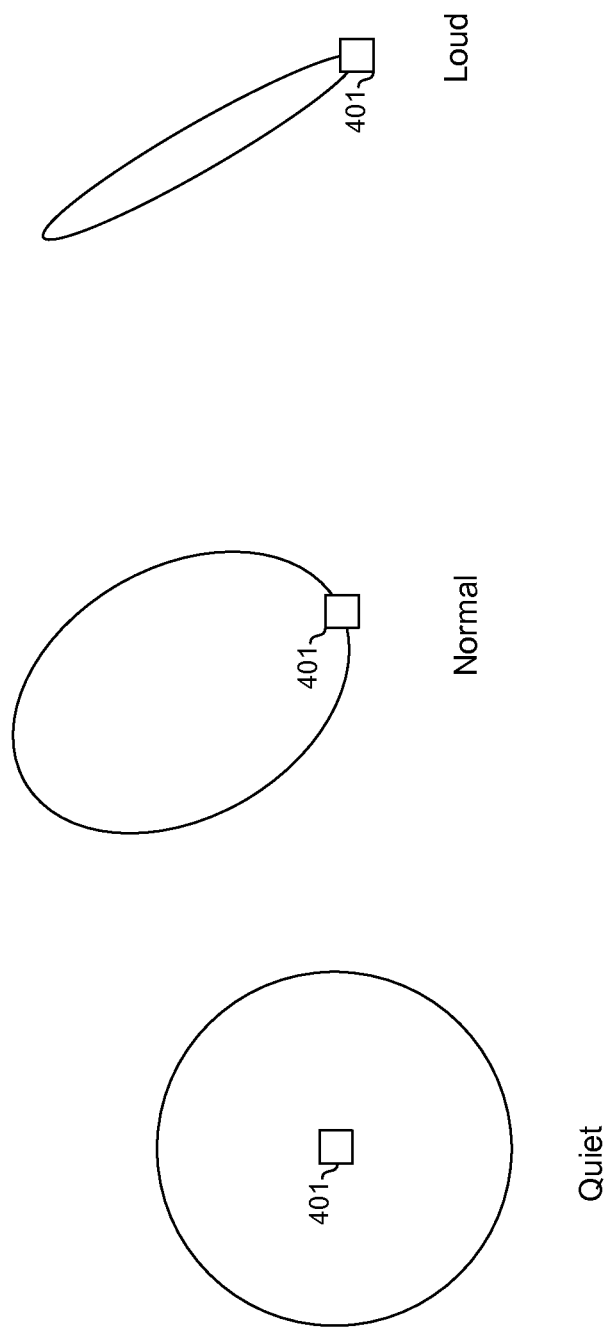
FIG. 4 depicts beam patterns for various modes in a programmable mode microphone.

FIG. 4 depicts beam patterns for various modes in a programmable mode microphone. Referring to FIG. 4, there is shown a beamforming microphone 401 in three different modes, "quiet," "normal," and "loud." As shown in the "quiet" mode, the beam pattern of the beamforming microphone 401 is configured to sense sound signals from all directions, while in the "loud" mode the beam pattern of the beamforming microphone 401 may be configured to have a narrow beam in a particular direction, such as towards the desired sound source. Finally, a "normal" mode may configure the beamforming microphone 401 in a more broadly focused beam directed at a desired source. The beam patterns shown in FIG. 4 are merely examples, and any desired beam pattern may be configured depending on the beamforming capability of the microphone.

The mode utilized by the beamforming microphone 401 may be a compromise between sound quality and desired noise reduction, where some sound quality of a desired source may be compromised for better noise reduction.

Figure 5:
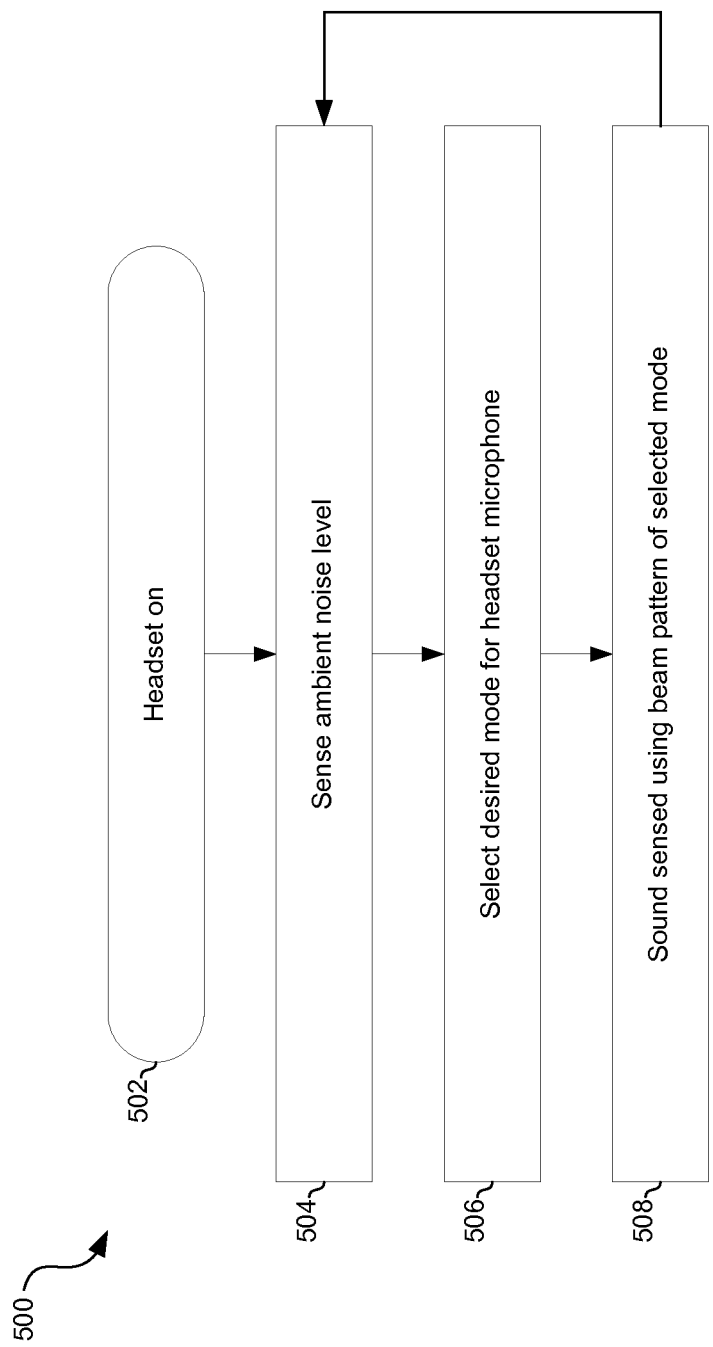
FIG. 5 is a flowchart illustrating an example process for headset microphone mode selection.

FIG. 5 is a flowchart illustrating an example process for headset microphone mode selection. Referring to FIG. 5, there is shown a flow chart 500, comprising a plurality of example steps.

In starting step 502, a headset (e.g., the headset 200) may be turned on and may be configured to begin operation in a wide beam pattern for subsequent ambient noise level sensing. In step 504, the ambient noise level may be sensed and compared to threshold levels for various modes of the headset, such as "quiet," "normal," and "noisy." The ambient noise level may be measured upon startup, periodically, or continuously, for example.

In step 506, a desired mode and associated beam pattern for the beamforming microphone in the headset may be selected. The mode may be selected by a user or may be automatically selected by the headset or associated game console based on the sensed ambient noise level. For example, in a noisy environment, a tight beam pattern may be configured to primarily sense a desired sound source, such as a user's voice, and in a quiet environment, a broad beam pattern may be utilized.

In step 508, sound may be sensed using the configured beam pattern as defined by the selected mode. The process may continue by continuing to step 504 again, sensing the ambient noise again and proceeding to mode selection in step 506. Accordingly, the monitoring of ambient noise and mode configuration may be performed continuously during operation of the headset or may proceed on a periodic basis, for example. In addition, the headset user may select a mode manually, or may be configured in a suitable mode at power up and remain in this mode if no changes in sound intensity above a certain threshold are detected.

In an example embodiment of the disclosure a headset with programmable microphone modes is disclosed and may comprise a headset comprising a speaker and a beamforming microphone, the system being operable to: sense an ambient sound level near the headset, and configure the headset in one of a plurality of modes by configuring a beam pattern of the beamforming microphone based on at least the sensed ambient noise level. A user of the headset may configure the headset in the one of the plurality of modes. The headset may automatically configure itself in the one of the plurality of modes.

The beamforming microphone may comprise an array of sound sensing elements. The headset may be configured in a quiet mode when the sensed ambient sound level is below that of a desired sound source. The beamforming microphone may be configured with a wide beam pattern when the headset is in the quiet mode. The headset may be configured in a loud mode when the sensed ambient sound level is above that of a desired sound source. The beamforming microphone may be configured with a narrow beam pattern directed at the desired sound source when the headset is in the loud mode. The headset may be configured in the one of the plurality of modes based on a location of the headset. The headset may be configured in the one of the plurality of modes by a gaming console.

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip. Some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system for processing audio signals, the system comprising:
    a headset comprising:
        a speaker;
        a beamforming microphone configured to sense an ambient sound level near the headset of sounds external to the headset; and
        an audio processing unit that configures the headset in one of a plurality of modes by configuring a beam pattern of the beamforming microphone comprising a plurality of microphone elements, said mode configuration based on at least the sensed ambient sound level, wherein the headset is configured in a wider quiet mode beam pattern when the sensed ambient sound level is below a level of sound from a user of the headset and in a narrower loud mode when the sensed ambient sound level is above the level of sound from the user of the headset.

2. The system of claim 1, wherein the user of the headset configures the headset in the one of the plurality of modes.

3. The system of claim 1, wherein the headset automatically configures itself in the one of the plurality of modes.

4. The system of claim 1, wherein the beamforming microphone comprises an array of sound sensing elements.

5. The system of claim 1, wherein the headset is configured in one of the plurality of modes on a continuous basis during operation of the headset.

6. The system of claim 1, wherein the beamforming microphone is configured with a wide beam pattern with full sensitivity from all directions when the headset is in the quiet mode.

7. The system of claim 1, wherein the headset is configured in a loud mode with the beamforming microphone configured with a narrow beam in a particular direction when the sensed ambient sound level is above that of a desired sound source.

8. The system of claim 7, wherein the beamforming microphone is configured with a narrow beam pattern directed at the desired sound source when the headset is in the loud mode.

9. The system of claim 1, wherein the headset is configured in the one of the plurality of modes based on a location of the headset.

10. The system of claim 1, wherein the headset is configured in the one of the plurality of modes by a gaming console.

11. A method for processing audio signals, the method comprising:
    in a headset that comprises a speaker, audio processing circuitry, and a beamforming microphone comprising a plurality of microphone elements:
        sensing, using the beamforming microphone, an ambient sound level near the headset of sounds external to the headset; and
        configuring, using the audio processing circuitry, the headset in one of a plurality of modes by configuring a beam pattern of the beamforming microphone based on at least the sensed ambient sound level, the headset being configured in a wider quiet mode beam pattern when the sensed ambient sound level is below a level of sound from a user of the headset and in a narrower loud mode beam pattern when the sensed ambient sound level is above the level of sound from the user of the headset.

12. The method of claim 11, wherein the user of the headset configures the headset in the one of the plurality of modes.

13. The method of claim 11, comprising automatically configuring the headset in the one of the plurality of modes.

14. The method of claim 11, wherein the beamforming microphone comprises an array of sound sensing elements.

15. The method of claim 11, comprising configuring the headset in one of the plurality of modes on a continuous basis during operation of the headset.

16. The method of claim 11, comprising configuring the beamforming microphone with a wide beam pattern with full sensitivity from all directions when the headset is in the quiet mode.

17. The method of claim 11, comprising configuring the headset in a loud mode with the beamforming microphone configured with a narrow beam in a particular direction when the sensed ambient sound level is above that of a desired sound source.

18. The method of claim 17, comprising configuring the beamforming microphone with a narrow beam pattern directed at the desired sound source when the headset is in the loud mode.

19. The method of claim 11, comprising configuring the headset in the one of the plurality of modes utilizing a gaming console.

20. A system for processing audio signals, the system comprising:
    a headset operable to communicatively couple to a gaming console, the headset comprising:
    a speaker;
    a beamforming microphone comprising a plurality of microphone elements operable to sense an ambient sound level near the headset of sounds external to the headset; and
    audio processing circuitry that configures the headset in one of a plurality of modes by configuring a beam pattern of the beamforming microphone based on at least the sensed ambient sound level wherein the headset is configured in a wider quiet mode beam pattern when the sensed ambient sound level is below a level of sound from a user of the headset and in a wider loud mode when the sensed ambient sound level is above the level of sound from the user of the headset.

* * * * *